United States Patent [19]

Nishibe et al.

[11] Patent Number: 5,304,514

[45] Date of Patent: Apr. 19, 1994

[54] DRY ETCHING METHOD

[75] Inventors: Tohru Nishibe, Tokyo; Shinya Nunoue, Ichikawa; Atsushi Kurobe, Yokohama, all of Japan

[73] Assignee: Kabushiki Kaisha Toshiba, Kawasaki, Japan

[21] Appl. No.: 687,569

[22] Filed: Apr. 19, 1991

[30] Foreign Application Priority Data

| Apr. 19, 1990 [JP] | Japan | 2-103541 |
| Aug. 20, 1990 [JP] | Japan | 2-218595 |
| Aug. 20, 1990 [JP] | Japan | 2-218596 |

[51] Int. Cl.$^5$ .............. H01L 21/00; H01L 21/02; H01L 21/302; H01L 21/463

[52] U.S. Cl. .................. 437/225; 437/228; 156/643

[58] Field of Search ............. 437/225, 228; 156/643

[56] References Cited

U.S. PATENT DOCUMENTS

| 4,659,449 | 4/1987 | Watanabe | 156/345 |
| 4,874,459 | 10/1989 | Coldren et al. | 156/643 |

FOREIGN PATENT DOCUMENTS 0386518 9/1990 European Pat. Off.

OTHER PUBLICATIONS

Sze, VLSI Technology, McGraw-Hill, 1988, pp. 215, 216, 218.
Proceedings of the 12th Int. Symp. on GaAs and related Compounds, Sep. 23-26, 1985, K. Asakawa, et al. pp. 373-378, "Suppression of Damage and Contamination on Reactive-Ion-Beam -Etched GaAs Surface Using a Novel UHV Etching System With. . ."
Journal of Vac. Science and Technology: Part B, vol. 3, No. 1, Jan./Feb. 1985, K. Asakawa, et al., pp. 402-405, "GaAs And AlGaAs Anisotropic Fine Pattern Etching Using A New Reactive Ion Beam Etching System".
Journal of Vac. Science and Technology: Part A, vol. 19, No. 4, Nov./Dec. 1981, M. W. Geis, et al., pp. 1390-1393, "A Novel Anisitropic Dry Etching Technique".
Applied Physics Letters, vol. 40, No. 7, Apr., 1982, R. A. Barker, et al., pp. 583-586, "Surface Composition and Etching of III-V Semiconductors in Cl$_2$ Ion Beams".
Journal of Applied Physics, vol. 66, No. 6, Sep. 15, 1989, F. Shimokawa, et al., pp. 2613-2618, "Reactive-Fast-Atom Beam Etching of GaAs Using Cl$_2$ GAS".
Japanese Journal of Applied Physics, Extended Abstracts 22th Conf. Solid State Devices and Materials, 1990, T. Nishibe, et al., pp. 473-476, "Dry Etching of InGaAsP/InP Structures by Reactive Ion Beam Etching Using Chlorine and Argon".
Record of Alloy Semiconductor Electronics Symposium, pp. 461-470, 1985, H. Yamada, et al., "Reactive Ion Etching For Integrated Opto-Electronic Devices Using III-V Alloy Semiconductors".
Dry Process Symposium, pp. 149-153, 1985, H. Yamada, et al., "Reactive Ion Etching of GaAsP and GaAs For Integrated Optical Devices".
J. Vac. Sci. Technol. B, vol. 3, pp. 884-888, May/Jun. 1985, H. Yamada, et al., "Anisotropic Reactive Ion Etching Technique Of GaAs and AlGaAs Materials For Integrated Optical Device Fabrication", No. 3.
Nuclear Instruments & methods in Physics Research, B7/8, pp. 814-819, 1985, N. L. DeMeo, et al., "Low Power Ion-Beam-Assisted Etching of Indium Phosphide".

Primary Examiner—Brian E. Hearn
Assistant Examiner—B. Everhart
Attorney, Agent, or Firm—Oblon, Spivak, McClelland, Maier & Neustadt

[57] ABSTRACT

The present invention provides a dry etching method, having the steps of introducing a mixed gas consisting of a reactive gas and an inert gas into a plasma chamber for generating a plasma, with the partial pressure of each of these gas components being controlled, exciting the mixed gas within the plasma chamber so as to generate ionized particles and excited particles having high reactivity, withdrawing the particles generated in the plasma chamber into a sample chamber having a compound semiconductor substrate housed therein, and physically and chemically etching the compound semiconductor substrate with the particles.

17 Claims, 10 Drawing Sheets

DRY ETCHING METHOD

BACKGROUND OF THE INVENTION

1. Field of the Invention

The present invention relates to a dry etching method for etching a compound semiconductor in the process of manufacturing a semiconductor device, particularly, to a dry etching method involving an ion beam irradiation.

2. Description of the Related Art

Recently, compound semiconductors such as III–V group compound semiconductors and II–VI group compound semiconductors are widely used in the manufacture of optical devices such as a semiconductor laser, a light emitting diode and a photodetector. The compound semiconductors, which exhibit a high mobility, are also used widely in the manufacture of electronic devices such as a field effect transistor and a hetero bipolar transistor. A dry etching method is employed for forming a fine structure in an optional portion of such a device.

To be more specific, the dry etching method is employed for forming, for example, a laser edge surface for integrating a semiconductor laser, for forming a groove for isolating each other a plurality of elements formed on a single substrate, and for forming a fine gate. When the dry etching method is employed for such a purpose, it is necessary for the working surface and the edge surface to be flat and for the shape of the edge surface to be controlled. Particularly, the light beam emitted from an active layer is taken out from the laser edge surface. It follows that the laser edge surface is required to be as flat and as vertical (perpendicular to the laser beam) as the cleavage surface in order to prevent a loss of light caused by the decrease in the reflectance at the edge surface.

It was customary to employ a reactive ion etching (RIE) or a reactive ion beam etching (RIBE) as the dry etching method. In RIE, the etching is carried out under a low vacuum, i.e., relatively high pressure. Thus, the ion beam fails to run precisely vertically. In other words, the ion beams are uneven, making it impossible to achieve a completely vertical processing. Such being the situation, RIBE which permits the etching treatment under a relatively high vacuum is widely employed for the so-called "vertical treatment".

However, the dry etching method utilizing RIBE gives rise to a serious problem. Specifically, a chemical reaction between reactive particles and the substrate and a physical sputtering achieved by the ions are involved in the etching performed by RIBE. The chemical reaction affects the flatness of the working surface, with the vertical of the working surface affected by the physical sputtering. However, RIBE is incapable of fully satisfying both the flatness and the vertical of the working surface. For example, it is necessary to sufficiently increase the partial pressure of the reactive gas in order to achieve a sufficient flatness of the working surface by RIBE. However, the vertical of the working surface is impaired, if the partial pressure noted above is unduly high.

It is also known to the art that the angle made between the substrate surface and the direction of the reactive beam is intentionally deviated from 90° so as to make the working surface, which should not be vertical originally, perpendicular to the substrate surface. In this technique, however, another surface fails to be perpendicular to the substrate surface, with the result that application of this technique in the manufacture an actual device is much restricted.

Figure 1:
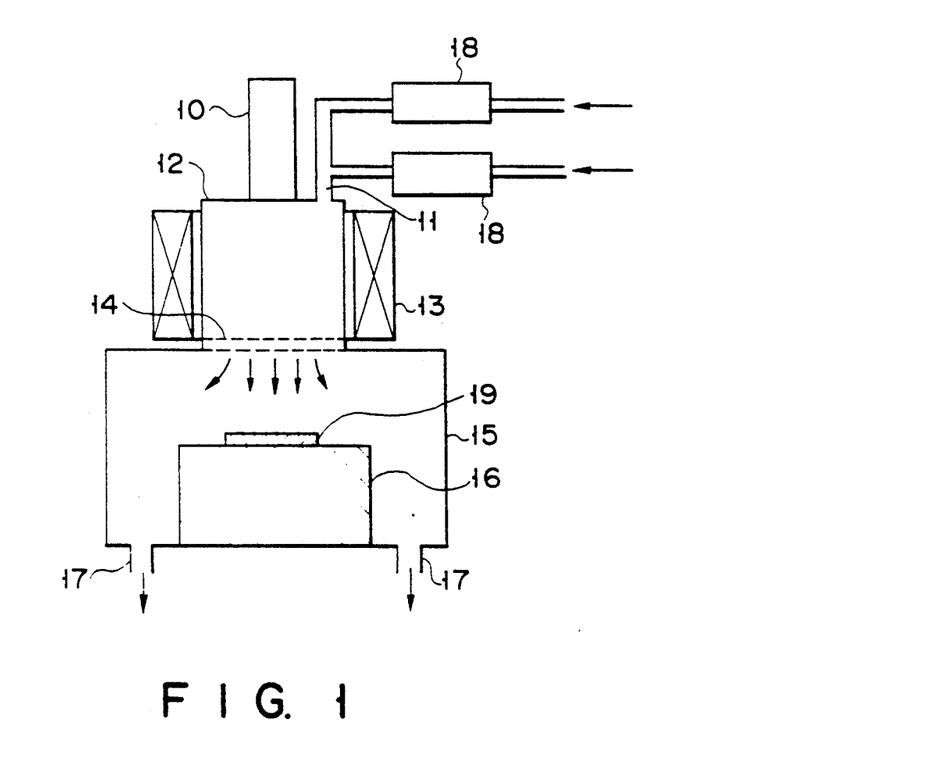
FIG. 1 schematically shows the construction of a reactive ion beam etching apparatus.

FIG. 1 shows a dry etching apparatus, e.g., a reactive ion beam etching (RIBE) apparatus. As seen from the drawing, the apparatus comprises a microwave guide 10, an etching gas inlet port 11, a plasma generating section 12, a coil 13 for generating a magnetic field, an ion extraction electrode 14, an etching chamber 15, a workpiece 19, a sample holder 16 on which the workpiece 19 is disposed, and a gas exhaust port 17. A reactive gas for the etching and an inert gas are supplied to the gas inlet port 11 through mass flow controllers 18. In the conventional etching method, the workpiece 19 is disposed first on the sample holder 16, followed by evacuating the etching chamber 15 using a vacuum pump. Then, the reactive gas is introduced into the plasma generating section through the mass flow controller 18 and the gas inlet port 11. It is possible to control the reactive gas pressure by controlling the gas flow rate through the mass flow controller 18. A microwave and a magnetic field are applied to the plasma generating section 12 so as to generate a plasma consisting essentially of ions, neutral radicals, electrons, and neutral molecules. The ions are extracted from the plasma generating section 12 by the ion extraction electrode 14 for irradiating the workpiece with said ions. In this step, a chemical reaction takes place between the workpiece and the reactive neutral radicals or neutral molecules. Also, the workpiece is sputtered by the ion bombardment so as to remove the product formed by the chemical reaction and, thus, to achieve an anisotropic etching. In the dry etching method utilizing a plasma, ion bombardment to the workpiece takes place so as to elevate the temperature of the workpiece to exceed a predetermined level during the etching treatment. Also, it takes a longer time for the temperature of the workpiece to be elevated to a predetermined level. Under the circumstances, the etching amount is not proportional to the etching time, making it difficult to control the etching amount by controlling the etching time.

In the dry etching method utilizing a plasma, a chemical reaction takes place between the workpiece and the neutral radicals or neutral molecules of the reactive gas. Thus, the etching rate is greatly dependent on the temperature of the workpiece. To be more specific, the etching rate is changed by the change in temperature of the workpiece caused by the ion irradiation during the etching treatment, giving rise to the problem that it is difficult to control the etching amount accurately as desired. To overcome this difficulty, it was proposed in the past to dispose a cooling mechanism or a heating mechanism on the sample holder in an attempt to control the temperature elevation of the workpiece during the etching treatment. However, temperature elevation of the workpiece was unavoidable during the etching treatment, making it difficult to control the etching treatment as desired.

For example, in the reactive ion beam etching (RIBE) voltage is applied across the electrodes so as to permit the generated electric field to extract the ions and excited particles under a controlled state from the plasma chamber onto the sample. In this step, the sample surface is contaminated by being sputtered the electrode. It is impossible to overcome the contamination problem, even if the electrode is made of a material which is unlikely to be sputtered such as molybdenum. It should be noted in particular that the extraction holes of the electrode are gradually enlarged by the sputtering of the electrode material, making it difficult to control the etching treatment as desired. For overcoming the difficulty so as to flatten the working surface, it is necessary to increase sufficiently the partial pressure of the reactive gas so as to remove the contaminant from the sample surface. If the partial pressure of the reactive gas is unduly increased, however, the vertical of etching is impaired. In the reactive ion etching (RIE), a plasma is generated within a sample chamber. When it comes to an apparatus in which a plasma is generated between a pair of electrodes, the apparatus is markedly contaminated with the sputtered material of the electrode material, with the result that the resultant element is adversely affected by the contamination.

As described above, it is difficult to etch a compound semiconductor by the conventional dry etching method such that the etched surface is perpendicular to an optional plane, and that the working surface and the working edge surface are flat. It is also difficult to prevent contamination derived from the peripheral parts such as the electrode.

SUMMARY OF THE INVENTION

An object of the present invention is to provide a dry etching method which permits etching a compound semiconductor perpendicularly to an optional surface and also permits providing a flat working surface and a flat working edge surface.

To achieve the object, the present invention provides a dry etching method, having the steps of introducing a mixed gas consisting of a reactive gas and an inert gas into a plasma chamber for generating a plasma, with the partial pressure of each of the reactive gas and the inert gas controlled appropriately; exciting the mixed gas within the plasma chamber so as to generate ionized particles and highly reactive excited particles; extracting these particles from the plasma chamber into a sample chamber housing a compound semiconductor substrate; and physically and chemically etching the compound semiconductor substrate with the particles.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates a presently preferred embodiment of the invention and, together with the general description given above and the detailed description of the preferred embodiment given below, serves to explain the principles of the invention.

DETAILED DESCRIPTION OF THE PREFERRED EMBODIMENTS

Figure 2:
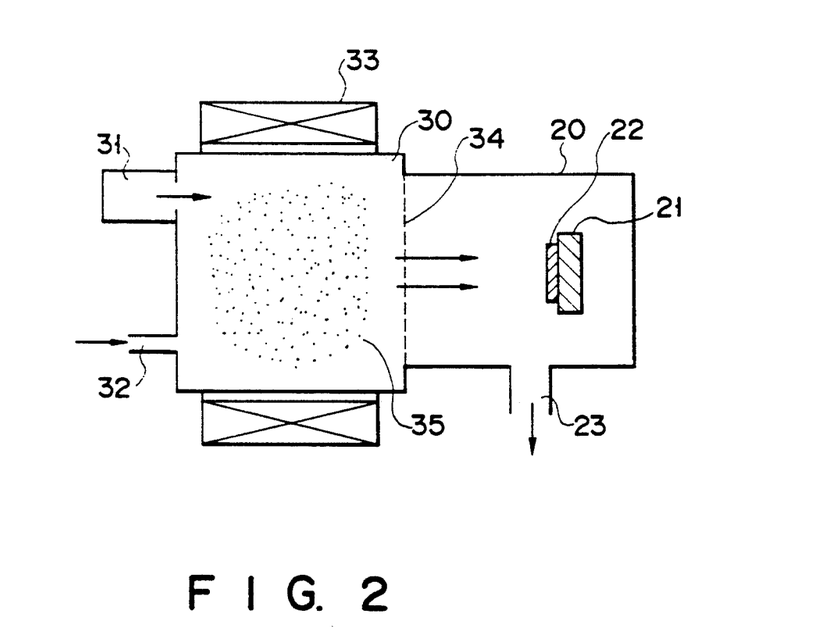
FIG. 2 schematically shows the construction of a dry etching apparatus according to one embodiment of the present invention, the apparatus being used for working the method of the present invention.

FIG. 2 schematically shows the construction of a dry etching apparatus (ECR plasma RIBE apparatus) according to one embodiment of the present invention, which is used for working the method of the present invention. As seen from the drawing, the apparatus comprises a sample chamber 20. An etching substrate 22 (i.e., a sample to be etched) disposed on a sample holder 21 is disposed within the sample chamber 20. It is desirable to dispose the substrate 22 within the sample holder in order to achieve a heat insulation i.e., in order to maintain the treating temperature in the vicinity of the substrate surface. The sample holder is made of a ceramic material such as steatite ($MgO \cdot SiO_2$), which has a relatively low thermal conductivity. The ceramic material is subject to the treatment in order to the heat insulation. The presence of the sample holder made of the particular material permits maintaining a elevated temperature caused by the irradiation of the substrate with a plasma.

The apparatus also comprises a plasma chamber 30. A microwave generated from a microwave generator 31 is introduced into the plasma chamber 30. Also, a predetermined gas is introduced through a gas inlet port 32 into the plasma chamber 30. A magnetic field generator 33 provided around the plasma chamber 30. Further, an extraction electrode 34 is disposed within the plasma chamber 30 on the side of the sample chamber 20.

The electrode 34 is made of a carbon-containing material and sized at 1 mm in thickness and 166 mm in diameter. Further, small holes each sized at 2 mm in diameter are formed at a pitch of 2.5 mm over the entire region of the electrode 34. Two electrodes 34 are disposed a predetermined distance apart from each other and voltage of 0 to 600 V is applied between these two electrodes 34.

The carbon-containing material used as the electrode 34 include, for example, a pyrolytic graphite prepared by subjecting hydrocarbons such as methane to a vapor phase thermal decomposition at about 200° C. so as to deposit a carbon film on a substrate, followed by peeling the carbon film from the substrate. The pyrolytic graphite is not corroded by a chlorine gas. Also, the pyrolytic graphite has a high hardness and, thus, is hardly sputtered even in the case of using a mixed gas consisting of a chlorine gas and an argon gas in an attempt to enhance the sputtering effect. It follows that the electrode 34 formed of pyrolytic graphite makes it possible to suppress the contamination of the workpiece, i.e., the material to be etched. The materials other than the pyrolytic graphite can also be used for forming the electrode 34. For example, it is possible to prepare the electrode by coating a substrate of iron, stainless steel, aluminum or silicon with a p-type diamond in a thickness of about 10 microns. Further, the electrode can be prepared by coating a carbon substrate having a high impurity content with a pyrolytic graphite. Still further, the pyrolytic graphite may be doped with a small amount of an impurity in order to increase the electrical conductivity and thermal conductivity of the electrode. The pyrolytic graphite may also be doped with another impurity in order to enhance the hardness of the electrode.

The sputtering rate caused by the ion bombardment under an argon gas pressure of $1 \times 10^{-3}$ Torr, an ion extraction voltage of 400 V, a magnetic field intensity of 875 gauses, and a microwave output of 200 W was examined with respect to the electrode materials exemplified above. Table 1 shows the results. Also, the time required for the depth of the sputtered region to reach $1 \times 10^5$ Å ($1 \times 10^4$ nm) was calculated on the basis of the obtained sputtering rate on the assumption that the expansion of the small hole made in the electrode, which is considered to adversely affect the etching control capability, is 0.1% and the corresponding depth of the sputtered region is $1 \times 10^5$ Å, as noted above.

TABLE 1

| Electrode Material | Sputtering Rate (Å/min) | Lifetime(H) |
| --- | --- | --- |
| Stainless Steel | 130 | 1500 |
| Molybdenum | 125 | 1600 |
| Carbon | 12 | 17000 |
| Pyrolytic | 8 | 25000 |
| Diamond-coated material | <5 | >40000 |

As seen from Table 1, the carbon-containing material used in the present invention for forming the electrode 34 is markedly lower in its sputtering rate than the conventional materials of stainless steel and molybdenum. In other words, the material specified in the present invention exhibits a high resistance to the sputtering. As a matter of fact, no change in the ion current density was recognized over 100 runs in the case of the electrode formed by using a pyrolytic graphite. In this experiment, the ion current density was found to be constant at 0.4 mA/cm$^2$.

For example, in the etching of a silicon nitride film formed on a silicon thin film with a mixed gas consisting of a CF$_4$ gas and H$_2$ gas, the use of a pyrolytic graphite electrode was found to reduce the contamination of the silicon nitride film to 1/10000.

The gas introduced into the plasma chamber 30 is excited by the microwave and the magnetic field so as to generate a plasma 35. The ionized particles and the excited particles having high reactivity contained in the plasma are extracted by the electrode 34 so as to be introduced into the sample chamber 20. The particles introduced into the sample chamber 20 collide against the substrate 22 and, then, are exhausted through the gas exhaust port 23.

Figure 3A:
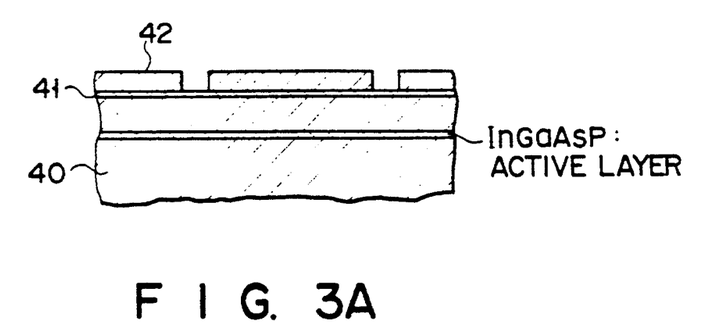
FIGS. 3A to 3C are cross sectional views collectively showing how to form a laser edge surface by using the apparatus shown in FIG. 2.
Figure 3B:
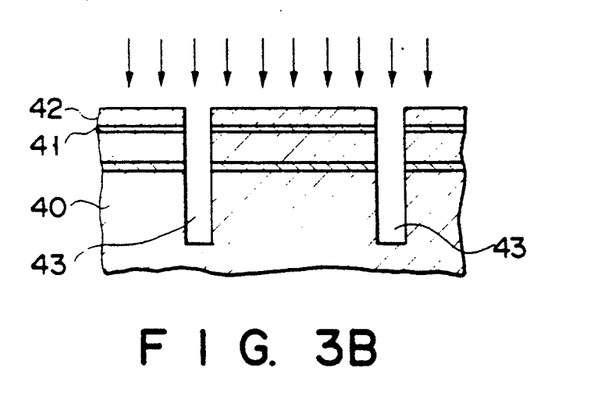

The method of the present invention is utilized for obtaining a vertical edge surface of an InGaAsP laser as follows. Specifically, an electrode 41 is formed on a mesa-buried type semiconductor laser wafer 40 having an InGaAsP active layer of 1.3 microns thick, followed by depositing a silicon dioxide film 42 by the CVD method under the atmospheric pressure and subsequently patterning the silicon dioxide film 42 so as to form grooves for the etching, as shown in FIG. 3A. In the next step, the laser wafer 40 is etched with the silicon dioxide film 42 used as a mask, as shown in FIG. 3B, so as to form a vertical edge surface of the laser. The apparatus shown in FIG. 2 is used in this etching step.

In the etching step described above, a mixed gas consisting of a chlorine gas and an argon was introduced into the plasma chamber 20 and excited under a microwave output of 200 W and a magnetic field intensity of 875 gauses so as to generate a plasma. Further, an ionized particles and an excited particles having high reactivity were extracted from the plasma into the sample chamber 20 under a extraction voltage of 400 V. The chlorine gas partial pressure and the argon gas partial pressure within the sample chamber were set at $7.5 \times 10^{-4}$ Torr and $1.4 \times 10^{-3}$ Torr, respectively. The resultant ion current density was found to be 0.24 mA/cm$^2$. Also, the temperature on the surface of the substrate 12 was elevated by the ion irradiation to 180° C. in about 2 minutes and, then, stabilized. Further, the depth of the etching groove 43 was 5 microns after the etching for 20 minutes.

Figure 3C:
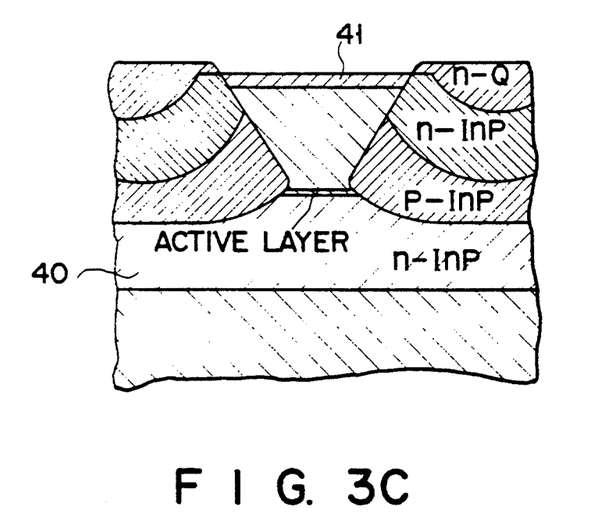

The etching mask 42 was removed by wet etching so as to expose the electrode 41. The threshold value of the resultant semiconductor laser was found to be substantially equal to that of a laser of a cleavage surface. The unevenness of the threshold value caused by the etching depicts a distribution within a plane of the laser wafer 40. FIG. 3C shows the shape of the edge surface exposed by the etching.

Let us describe the optimum conditions in the step of etching a compound semiconductor, i.e., the optimum conditions with respect to the partial pressure of the reactive gas, the partial pressure of the inert gas, the substrate temperature, etc. In applying a dry etching to a structure including a hetero junction of InGaAsP-/InP, it is important to take it into consideration that InGaAsP and InP differ from each other in the etching properties. The etching properties of InP and GaAs were examined on the assumption that InGaAsP is equal to a mixture prepared by mixing InP and GaAs at a certain mixing ratio.

Figure 4:
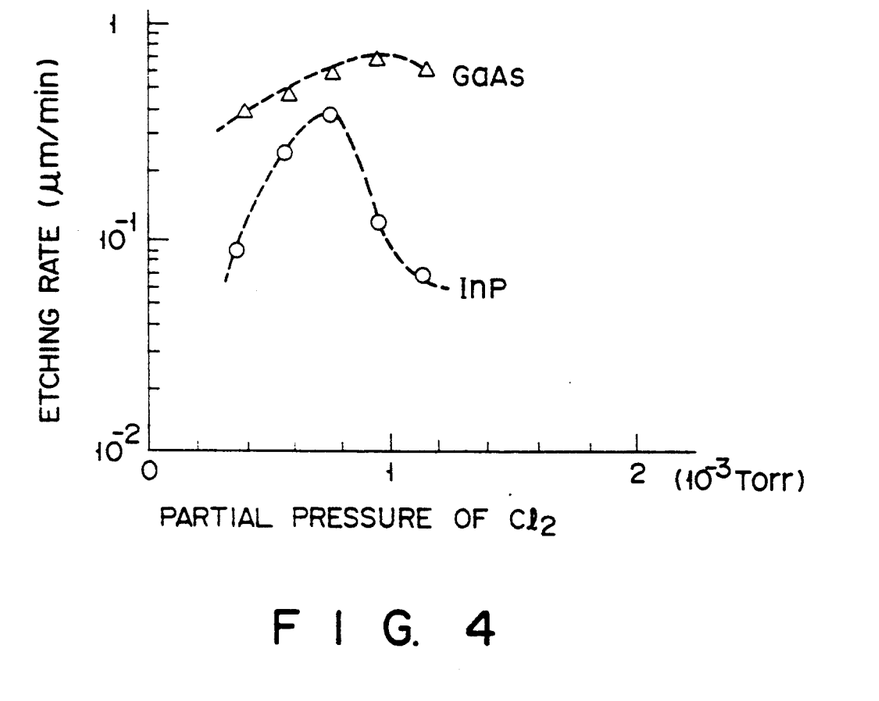
FIGS. 4, 10 and 13 are graphs each showing the relationship between the partial pressure of a chlorine gas and the etching rate in the case of using a mixed gas consisting of an argon gas and a chlorine gas.
Figure 5:
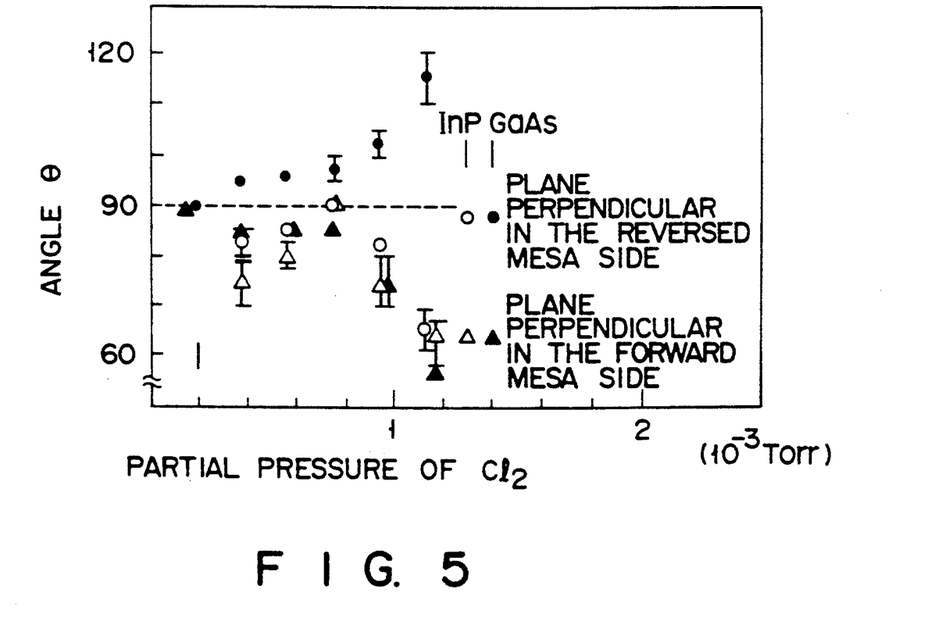
FIGS. 5 and 12 are graphs each showing the relationship between the partial pressure of a chlorine gas and the angle of the etched side wall.
Figure 6:
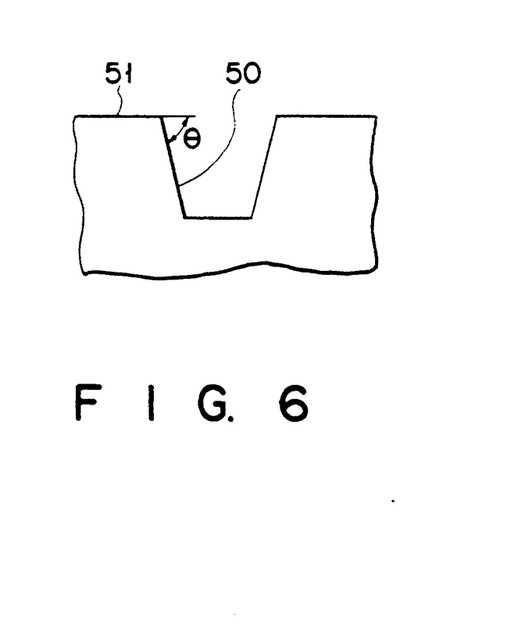
FIGS. 6 and 11 are cross sectional views each showing the angle made by the etched side wall.

FIG. 4 shows the relationship between the etching rate and the chlorine gas pressure with respect to InP and GaAs. On the other hand, FIG. 5 shows the relationship between the chlorine gas pressure and the angle made between the etching side wall and the substrate surface. The angle noted above represents an angle $\theta$ made between the etching side wall 5 and the extended plane of the substrate surface 51 as shown in FIG. 6.

FIG. 4 covers the case where a chlorine gas and an argon gas were introduced into the plasma chamber, and ionized particles and excited reactive particles were generated under a microwave output of 200 W and a magnetic field intensity of 875 gausses. The ions and particles were extracted from the plasma chamber into the sample chamber under an extraction voltage of 400 V. In this experiment, the argon gas partial pressure was set at $1.4 \times 10^{-4}$ Torr. As seen from FIG. 4, the etching rate of InP reaches a peak in the case where the chlorine gas partial pressure is set at $7.5 \times 10^{-4}$ Torr. On the other hand, FIG. 5 shows that the angle $\theta$ made between the etching side wall and the substrate surface is 90° in the case where the chlorine gas partial pressure is $7.5 \times 10^{-4}$ Torr in the etching of InP. Where the chlorine gas partial pressure deviates from $7.5 \times 10^{-4}$ Torr, the angle $\theta$ is smaller than 90°.

On the other hand, the etching properties in a plane of the forward mesa type differ from that in a plane of the reversed mesa type when it comes to GaAs. Thus, the angles made between the substrate surface and the etching side surface were 85° and 95°, respectively. As a matter of fact, the active layer was formed of InGaAsP and, thus, the properties of the active layer were close to those of InP. The angle $\theta$ was found to be about 90° in a compound semiconductor having an InGaAsP active layer 1.3 microns thick. When it comes to the etching of the InP layer, the difference in the etching rate between the GaAs layer and the InP layer becomes minimum at the point of the highest etching rate of the InP layer. In this case, the etching is close to the constant-rate-etching. As a result, the generation of a stepped portion in the vicinity of the hetero junction can be suppressed by selecting such conditions, leading to a vertical etching.

In the case of InP, impurities and chlorides are adsorbed to the substrate surface if the temperature of the substrate surface elevated by the plasma irradiation is lower than 150° C., resulting in failure to provide a smooth surface. If the temperature of the substrate surface exceeds 200° C., however, the side etching proceeds, making it difficult to achieve a vertical processing. Under the circumstances, it is necessary to maintain the temperature of the substrate surface at 150° to 200° C. in order to obtain a flat working surface while suppressing the side etching in the case of InP. Likewise, the substrate surface temperature should be maintained at 50° to 150° C. in the case of GaAs, at 100° to 160° C. in the case of including an InGaAsP active layer having a thickness of 1.3 microns, and at 130° to 180° C. in the case of including an InGaAsP active layer having a thickness of 1.5 microns.

Figure 7:
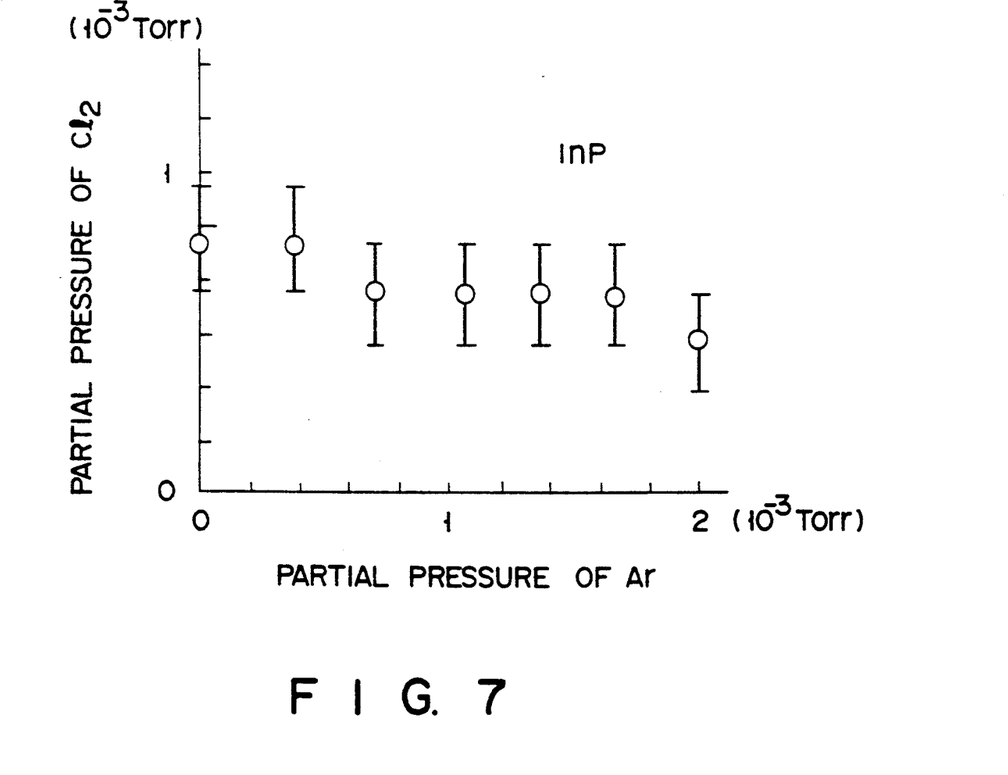
FIG. 7 is a graph showing the range of the partial pressure of a chlorine gas, within which a vertical etching can be achieved, relative to the partial pressure of an argon gas.

As described above, it is possible to achieve a flat and vertical etching by controlling the partial pressure of an argon gas as an inert gas at $1.4 \times 10^{-3}$ Torr and the partial pressure of a chlorine gas as a reactive gas at about $7.5 \times 10^{-4}$ Torr. However, if the argon gas partial pressure is changed, it is necessary to change the chlorine gas partial pressure in order to obtain a vertical and flat etching surface. FIG. 7 shows the range of the chlorine gas partial pressure which permits the angle $\theta$ to fall within a range of 85° to 95° C. as well as the chlorine gas partial pressure which permits the angle $\theta$ to be 90°. Naturally, an increase in the argon gas partial pressure leads to a decrease in the chlorine gas partial pressure. It should be noted that, if the argon gas partial pressure is unduly low, it is impossible to obtain a flat etching surface. It has been found that a flat etching surface can be obtained if the argon gas partial pressure is at least $6 \times 10^{-4}$ Torr.

Where the argon gas partial pressure is set as described above, a range of the chlorine gas partial pressure which permits the angle $\theta$ of 85° to 95° is substantially equal to a range of the chlorine gas partial pressure which permits the highest etching rate. To be more specific, if the argon gas partial pressure is changed, the graph of FIG. 4 showing the etching rate of InP is shifted to the right or left. The chlorine gas partial pressure which permits the highest etching rate of InP falls within the range shown in FIG. 7. It follows that, in order to achieve a vertical etching to obtain a flat etching surface, it is necessary to set the argon gas partial pressure at $6 \times 10^{-4}$ Torr or more and to set the chlorine gas partial pressure at, for example, $1 \times 10^{-4}$ to $1.2 \times 10^{-3}$ Torr about which the highest etching rate can be obtained. More preferably, the temperature condition should be set to fall within the range described previously depending on the kind of the compound semiconductor material to be etched.

As described above, it is possible to control the angle $\theta$ at a desired value other than 90° by suitably changing the partial pressure of the each of the mixed gas.

Figure 8:
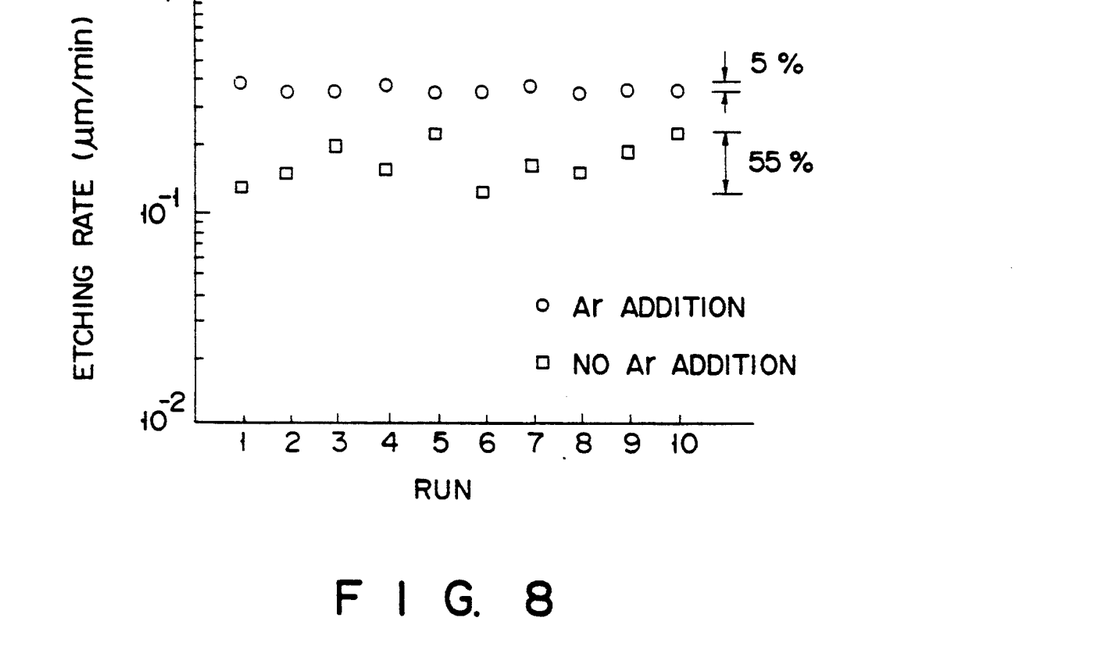
FIG. 8 is a graph showing the unevenness of the etching rate caused by the presence or absence of an argon gas.
Figure 9:
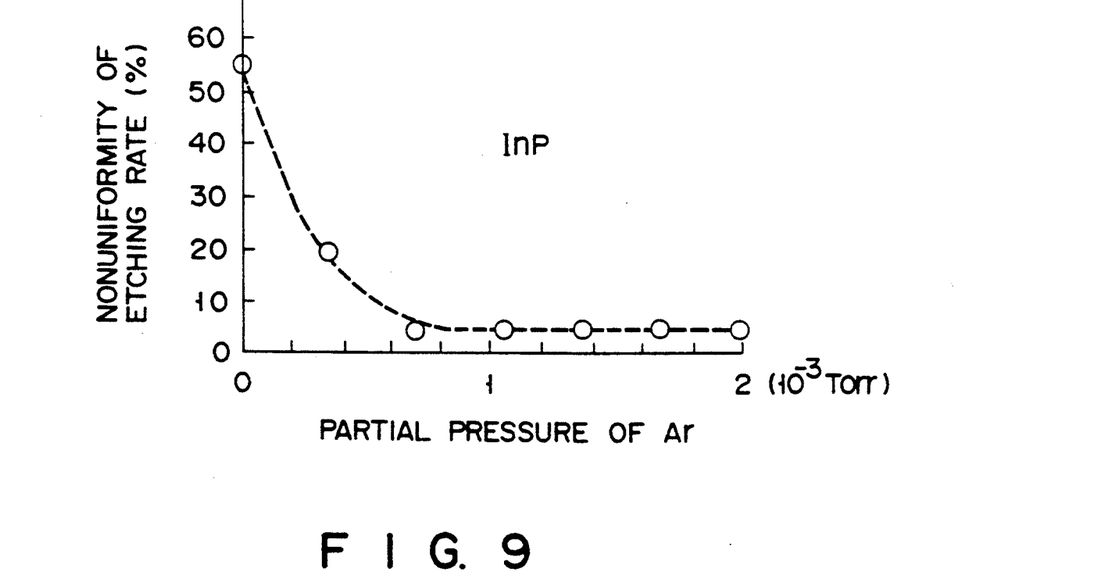
FIG. 9 is a graph showing the unevenness of the etching rate relative to the partial pressure of an argon gas.

FIG. 8 shows the 7 nonuniformity in the etching rate covering the use of a mixed gas consisting of an argon gas having a partial pressure of $1.4 \times 10^{-3}$ Torr and a chlorine gas having a partial pressure of $7.5 \times 10^{-4}$ Torr and also covering the use of a chlorine gas alone having a partial pressure of $7.5 \times 10^{-4}$ Torr. In the case of using a chlorine gas alone, the etching rate is low and nonuniform as a whole since the sputtering effect is reduced. In the case of a mixed gas, however, the nonuniformity in the etching rate is within 5%. FIG. 9 is a graph showing a relationship between the nonuniformity of the etching rate and the argon gas partial pressure under the condition that the chlorine gas partial pressure is fixed at $7.5 \times 10^{-4}$ Torr. As seen from the graph, the nonuniformity of the etching rate is less than 5% where the argon gas partial pressure is at least $6 \times 10^{-4}$ Torr.

As described above, the method of the present invention can be effectively employed in the etching of a compound semiconductor material such as InP/InGaAsP by means of RIBE method. In the case of using a mixed gas consisting of a chlorine gas as a reactive gas and an argon gas as an inert gas, the method of the present invention permits achieving a vertical and flat etching surface in an optional plane of the compound semiconductor material by suitably selecting the partial pressure of each of the mixed gas. Also, FIGS. 8 and 9 support that the use of the mixed gas makes it possible to achieve the etching with a constant etching rate.

Figure 10:
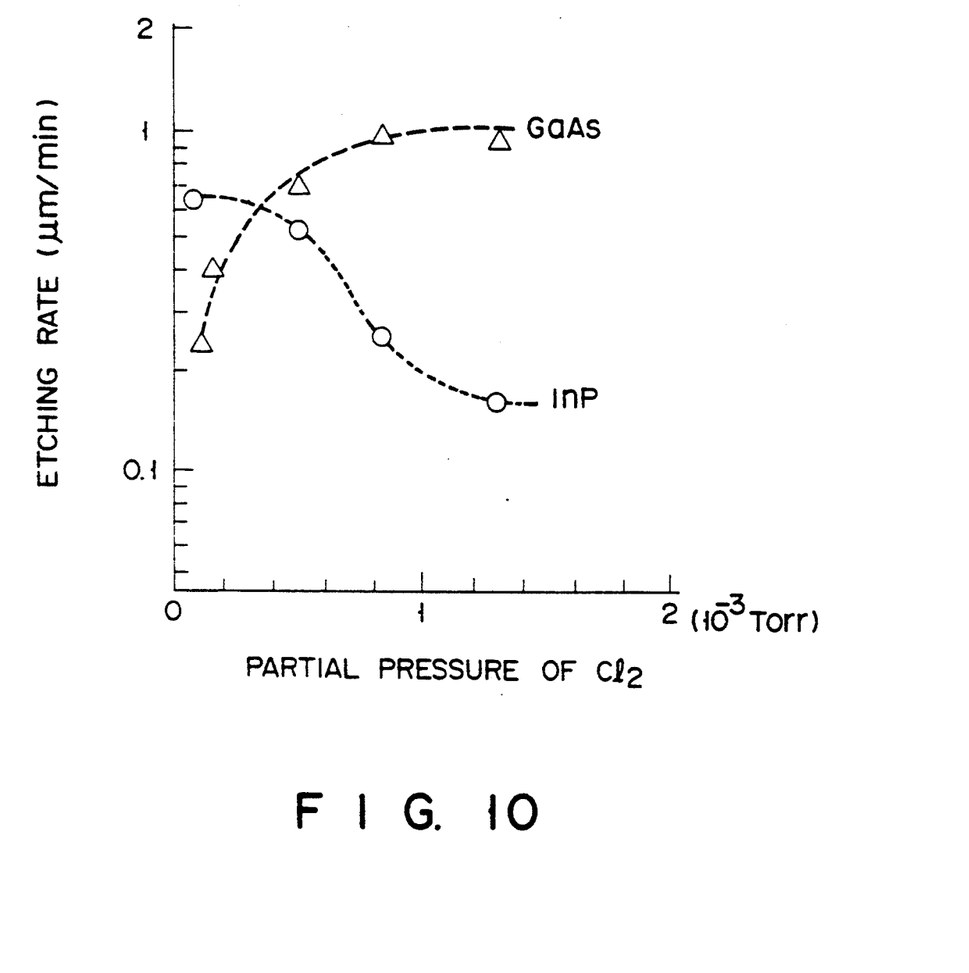

FIG. 10 shows the etching rates of GaAs and InP in the case where the ion current density is increased by improving the efficiency of extracting the ionized particles and excited particles into the sample chamber. In this experiment, the etching was carried out under an argon gas partial pressure of $1.1 \times 10^{-3}$ Torr, a microwave output of 200 W, an ion extraction voltage of 400 V, and a magnetic field intensity of 875 gausses, as in the experiments described previously. However, the ion current density was about 20% higher than in the previous experiments, which was causes by the improvement in the ion extraction efficiency. In this case, the InP etching rate was high where the chlorine gas partial pressure was lower than $0.4 \times 10^{-3}$ Torr. On the other hand, the GaAs etching rate was high in the case where the chlorine gas partial pressure was higher than 0.4

Figure 11:
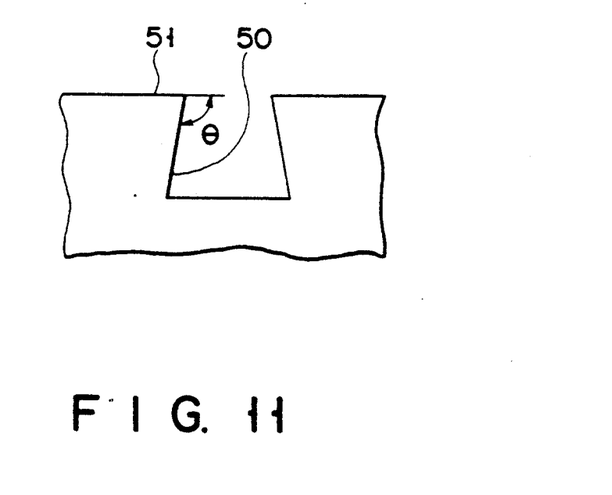
Figure 12:
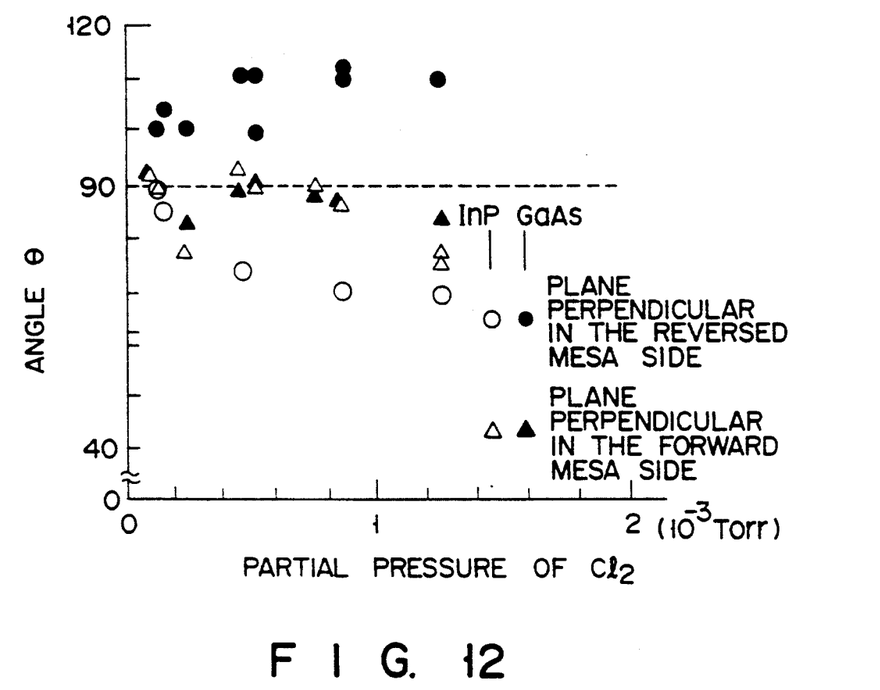

$10^{-3}$ Torr. FIG. 11 shows the shape of the side wall of a groove formed in the InP or GaAs layer. In this case, it is possible to achieve a vertical etching of the InP layer by selecting the chlorine gas partial pressure which permits the highest etching rate of InP. Under this condition, however, a very high sputtering effect is brought about by the argon gas addition, resulting in failure to achieve a flat etching surface. Further, damage is done to reach deep inside the crystal because the ion current density is as high 0.5 mA/cm$^2$. As shown in FIG. 12, a vertical side wall can be obtained even if the chlorine gas partial pressure is set at a value other than the value at which the highest InP etching rate can be obtained, i.e., at a value of, for example, $5 \times 10^{-4}$ Torr. It has been confirmed that a flat etching surface can be obtained at the chlorine gas partial pressure range noted above. It has also been confirmed that the InP and GaAs etching rates are substantially the same under this condition. In other words, it is necessary to select the chlorine gas partial pressure giving the optimum conditions for achieving the vertical and flat etching surface in accordance with the relationship between the curves denoting the InP and GaAs etching rates. In the cases of, for example, FIGS. 10 and 12, it is desirable to select the chlorine gas partial pressure giving the optimum conditions for achieving the vertical and flat etching surface such that InP and GaAs are etched at the same etching rate.

Under the conditions which permit the same etching rate of InP and GaAs, the etching rate is constant regardless of the composition of the InGaAsP crystal layer and the number of crystal layers stacked one the other. This makes it possible to control the depth of the etching without difficulty. If the chlorine gas partial pressure is set at $1 \times 10^{-4}$ to $1.2 \times 10^{-3}$ Torr in the case of FIG. 12, the etching can be achieved at the angle $\theta$ of 85°.

Figure 13:
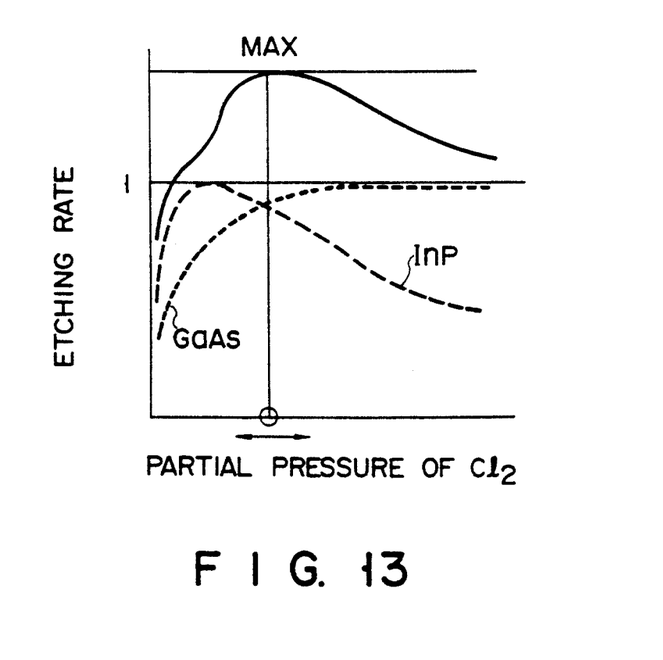

The etching tendency described previously in conjunction with FIG. 10 is applicable in general to various materials. Specifically, curves of etching rates are depicted as in the cases of InP and GaAs and the data is normalized in such a way that the largest etching rate is 1. The highest normalized etching rate is determined based on the arithmetic mean, as in FIG. 13. Under this condition, the chlorine gas partial pressure is set to achieve the highest etching rate so as to obtain the similar effect.

Halogen gases such as chlorine gas bromine gas, fluorine gas and iodine gas can be used in the present invention as a reactive gas. Further, halogen atom containing gases such as $SiCl_4$, $CH_3Cl$, $BCl_3$ may be used as a reactive gas. On the other hand, argon gas nitrogen gas, xenon gas, krypton gas or helium gas can also be used in the present invention as the inert gas. The mixed gas used in the present invention may be an optional combination of a single reactive gas and a single inert gas. Of course, a plurality of optional reactive gases may be combined with a plurality of optional inert gases so as to form a mixed gas. Where the mixed gas consists of, for example, a bromine gas as a reactive gas and a nitrogen gas as an inert gas, the nitrogen gas partial pressure and the bromine gas partial pressure are determined such that InP and GaAs are etched at the same rate.

The present invention is not restricted to the embodiments described above. For example, a RIBE apparatus using an ECR ion source was used in the embodiment described above. However, it is not absolutely necessary to use the RIBE apparatus, as far as the apparatus is constructed such that a gas is excited in a plasma chamber so as to form ionized particles and highly reactive excited particles, and these particles are extracted into a sample chamber. Further, the technical idea of the present invention can also be applied to the etching of GaAlAs/InAs series material, InGaAlP/GaAs series material, and GaAlAs/GaAs series material as well as to the etching of a multi-layered film of a II-VI group compound semiconductors such as ZnSe and CdHgTe. Still further, various modifications are included in the technical scope of the present invention.

Described below are Examples of the present invention, in which the apparatus shown in FIG. 1 was used for working the method of the present invention.

EXAMPLE 1

Figure 14:
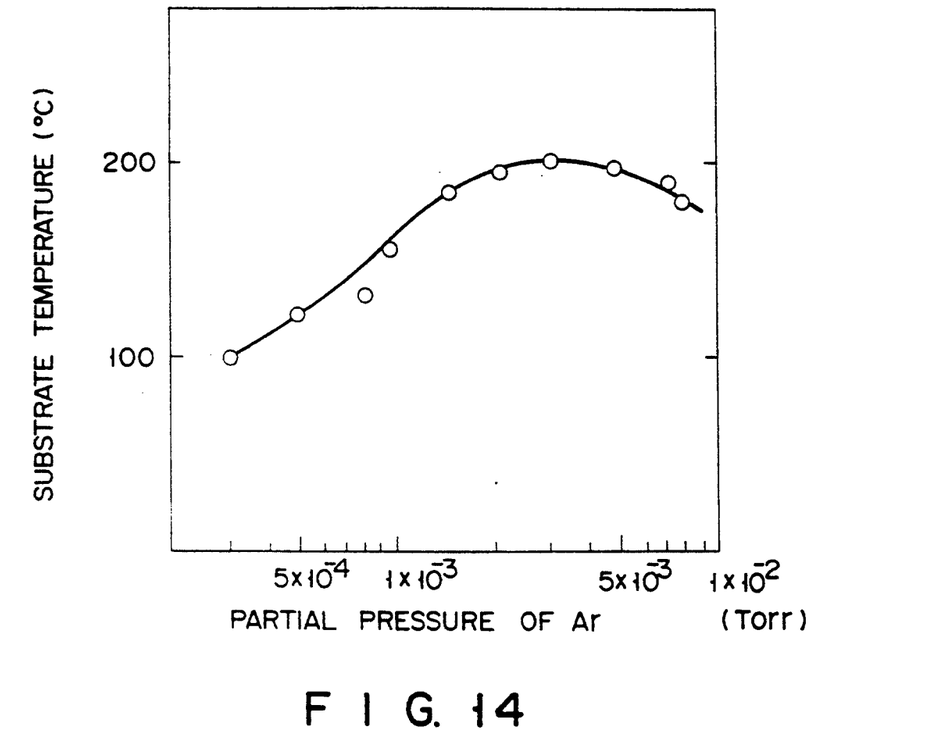
FIG. 14 is a graph showing the relationship between the partial pressure of an argon gas and the temperature of the workpiece.

An argon gas was introduced into the plasma chamber so as to generate a plasma under a microwave output of 200 W, a magnetic field intensity of 875 gauses, and an ion extraction voltage of 400 V. FIG. 14 shows the relationship between the argon gas pressure and the temperature of the etching material, i.e, the material to be etched. It is possible to elevate the temperature of the etching material to a desired level by controlling the pressure of the argon gas supplied to the plasma chamber based on the data shown in FIG. 14 so as to carry out the etching with a reactive gas. In the experiments described below, an InP substrate or a GaAs substrate were used as the etching material, a chlorine gas was used as the reactive gas, and the etching treatment was carried out at a temperature of 180° C. Further, a pyrolytic graphite was used as the electrode material.

Figure 15A:
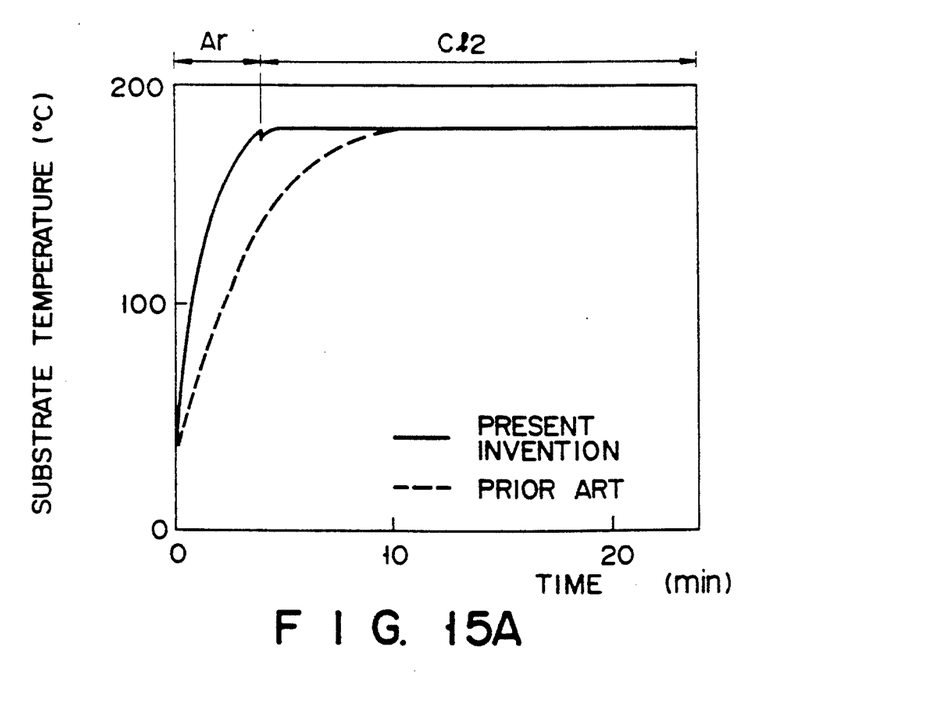
FIG. 15A is a graph showing the change with time in the temperature of the workpiece.
Figure 15B:
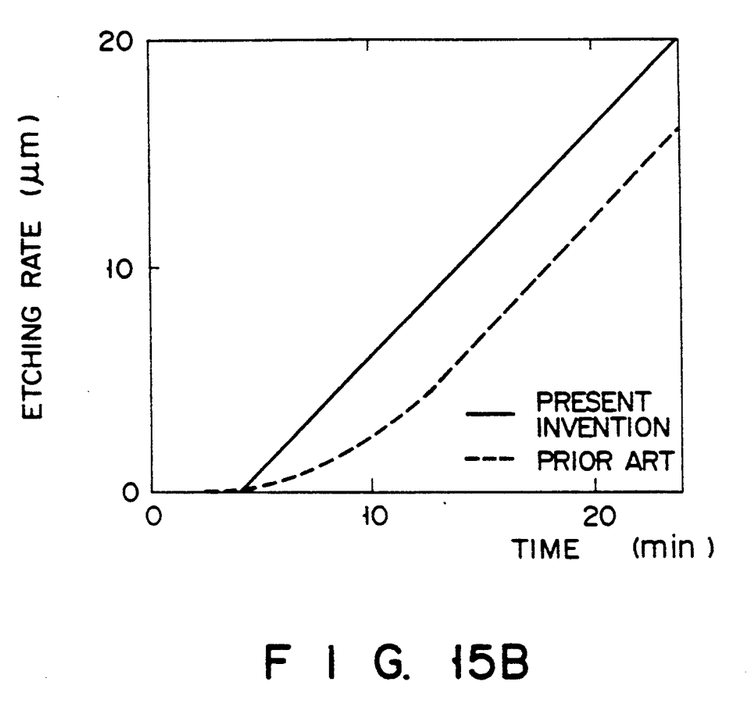
FIG. 15B is a graph showing the relationship between the etching amount of GaAs and the etching time.

In the first step, the etching material 20 made of an InP substrate or a GaAs substrate was disposed on the sample holder 16, followed by evacuating the chamber 15 to a vacuum of $1 \times 10^{-7}$ Torr by using a vacuum pump. Then, an argon gas was supplied to the plasma chamber through the mass flow controller 18 and the gas input port 11. The argon gas pressure within the plasma chamber was set at $2 \times 10^{-3}$ Torr so as to carry out the etching with a chlorine gas at 180° C. A plasma was generated under a microwave output of 200 W and a magnetic field intensity of 875 gauses, and the ions contained in the plasma thus generated were extracted from the plasma chamber by the electrode 14 under the ion extraction voltage of 400 V so as to irradiate the InP substrate or GaAs substrate with the ions for 4 minutes. The substrate temperature was elevated from room temperature to 180° C. by the ion bombardment. Then, the argon gas supply to the plasma chamber was stopped and, at the same time, a chlorine gas was supplied to the plasma chamber so as to set up a pressure of $6.1 \times 10^{-4}$ Torr. The substrate temperature was temporarily lowered by the chlorine gas supply. However, the temperature reduction in this step was at most 5° C. In the subsequent etching treatment with the reactive gas, the substrate temperature was recovered to 180° C., making it possible to continue to carry out the etching treatment at a constant temperature. The etching with the reactive gas was carried out under a microwave output of 200 W, a magnetic field intensity of 875 gauses, and an ion current density of 0.02 mA/cm$^2$. FIG. 15A is a graph showing the changes of the substrate temperature during the dry etching treatment. In the graph of FIG. 15A, the time for the entire etching process is plotted on the abscissa. The solid line and the broken line shown in FIG. 15A denote the present invention and the prior art, respectively. The graph clearly shows that the method of the present invention permits markedly shortening the time required for elevating the substrate temperature to a desired level. FIG. 15B shows the relationship between the etching amount and the etching time. In the graph of FIG. 15B, the etching time starting with initiation of the chlorine gas supply is plotted on the abscissa. As seen from the graph, the amount of etching achieved by the reactive ga is linearly changed with the etching time in the etching method of the present invention denoted by a solid line. It follows that it is possible to control the etching amount by controlling the etching time. It is also seen that the method of the present invention permits stabilizing the etching treatment in a shorter time than in the prior art denoted by a broken line.

It should also noted that contamination of the apparatus caused by the sputtering of the electrode material was not recognized at all.

EXAMPLE 2

Figure 16:
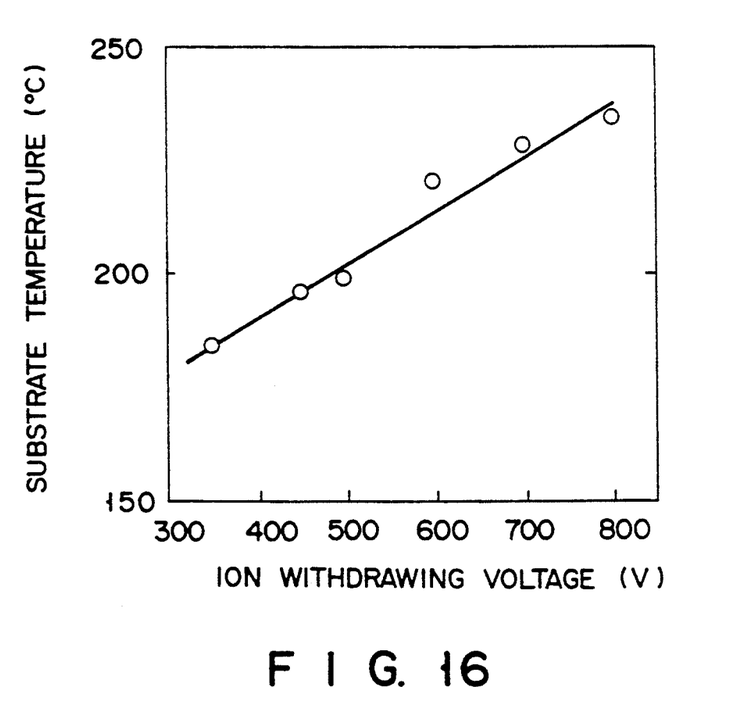
FIG. 16 is a graph showing the relationship between the ion extraction voltage and the temperature of the workpiece.

An argon gas was introduced into the plasma chamber to set up a pressure of $1.0 \times 10^{-3}$ Torr, and a dry etching was carried out under an ion current density of 0.4 mA/cm$^2$. FIG. 16 shows the relationship between the ion extraction voltage and the substrate temperature obtained in this experiment. In this experiment, the ion extraction voltage for elevating the substrate temperature with the argon gas was determined in accordance with the substrate temperature in the etching step with the chlorine gas. After the substrate temperature was elevated under this condition, a chlorine gas was supplied and, at the same time, the ion extraction voltage was set at a desired level. In this experiment, the etching amount was found to be changed linearly with the etching time, as in the data shown in FIG. 15B, making it possible to control the etching amount by controlling the etching time.

EXAMPLE 3

Figure 17:
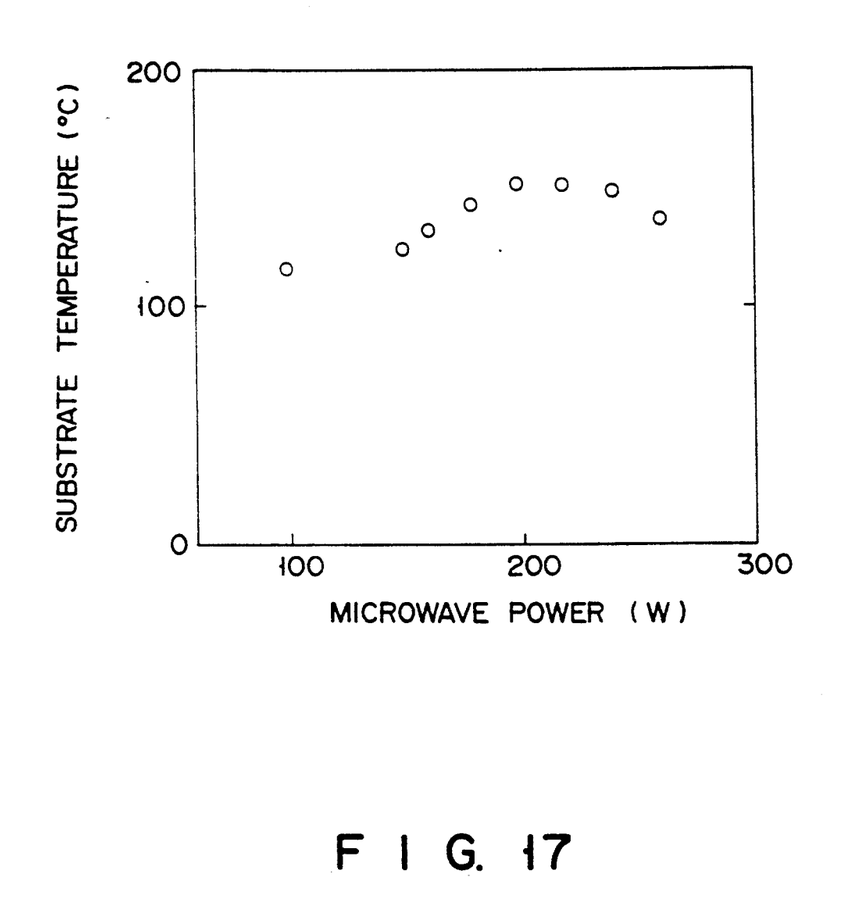
FIG. 17 is a graph showing the relationship between the microwave power and the temperature of the workpiece.

FIG. 17 shows the relationship between the microwave power and the substrate temperature under an argon gas pressure of $1.0 \times 10^{-3}$ Torr and an ion extraction voltage of 400 V. As seen from FIG. 17, the microwave power for elevating the substrate temperature with the argon gas was determined in accordance with the substrate temperature in the etching step with the chlorine gas. After the substrate temperature was elevated under this condition, a chlorine gas was supplied and, at the same time, the microwave power was set at a desired level. In this experiment, the etching amount was found to be changed linearly with the etching time, as in the data shown in FIG. 15B, making it possible to control the etching amount by controlling the etching time.

In the Examples described above, the technical idea of the present invention is applied to ECR-RIBE. However, application of the technical idea of the present invention need not be restricted to ECR-RIBE. For example, it is possible to apply the technical idea of the present invention to RIE and magnetron RIE.

In the present invention, the etching is carried out under a relatively high vacuum, with the result that the ion beams are aligned and the etching can be achieved vertically. Also, a sputtering and a chemical reaction take place simultaneously in the present invention, making it possible to flatten the working surface or the working edge surface. What should also be noted in that a mixed gas consisting of a reactive gas and an inert gas is used in the present invention, with the result that the reaction product attached to the chamber can be removed by the sputtering effect. It follows that the plasma state is stabilized so as to stabilize the etching step and to control the etching operation without difficulty.

In the dry etching method of the present invention, the substrate temperature is elevated in advance by the collision with the plasma of an inert gas. The particular technique makes it possible to shorten the time required for elevating the temperature of the etching material to a desired level. What should also be noted is that, in the method of the present invention, it is possible to remove the natural oxide formed on the surface of the etching material. The natural oxide is formed in the initial stage of the etching with a reactive gas and inhibits the progress of the etching treatment. It follows that the removal of the natural oxide achieved in the present invention makes it possible to control accurately the etching amount by controlling the etching time.

Further, the dry etching apparatus of the present invention permits sufficiently preventing the etching material from being contaminated with a material sputtered from the electrode during the etching treatment. In addition, the electrode is not corroded in the present invention, making it possible for the electrode to withdraw the ion beam stably over a long period of time.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dry etching method comprising the steps of:
    introducing an inert gas into a plasma chamber for generating a plasma, followed by exciting the inert gas so as to generate ionized particles;
    irradiating a compound semiconductor substrate made of a combination of at least two elements selected from the group consisting of In, Ga, As, and P and having a hetero-junction formed therein, adjacent layers forming the hetero-junction differing from each other in composition, with the ionized particles so as to elevate the temperature of the compound semiconductor substrate;
    stopping the inert gas introduction;
    introducing a reactive gas or a mixed gas containing an inert gas and a reactive gas, followed by exciting the introduced gas so as to generate ionized particles; and
    irradiating the compound semiconductor substrate with the ionized particles so as to carry out etching at the elevated temperature of the compound semiconductor substrate, the partial pressures of the inert gas and the reactive gas being controlled so as to achieve the same etching rate in each layer of the hetero-junction.

2. The dry etching method according to claim 1, wherein the temperature of the compound semiconductor substrate is controlled in accordance with the kind of the compound semiconductor.

3. A dry etching method comprising the steps of:
    providing a mixed gas by introducing at least one reactive gas and at least one inert gas into a plasma chamber for generating a plasma via gas flow adjusting means capable of controlling the flow rate of said reactive and inert gases into the plasma chamber and capable of controlling the partial pressure of each of said reactive and insert gases within the plasma chamber;

exciting the mixed gas within the plasma chamber so as to generate ionized particles and excited particles having high reactivity;

extracting the particles from the plasma chamber into a sample chamber having a compound semiconductor substrate made of a combination of at least two elements selected from the group consisting of In, Ga, As, and P housed therein, said compound semiconductor having a hetero-junction formed therein, adjacent layers forming the hetero-junction differing from each other in composition; and physically and chemically etching the compound semiconductor substrate with the ionized particles and with the excited particles, respectively, the partial pressures of the inert gas and the reactive gas being controlled so as to achieve the same etching rate in each layer of the hetero-junction.

4. The dry etching method according to claim 3, wherein a halogen gas is used as the reactive gas and an argon gas is used as the inert gas.

5. The dry etching method according to claim 4, wherein the halogen gas is a chlorine gas.

6. The dry etching method according to claim 5, wherein the partial pressure of the argon gas is set at $6 \times 10^{-4}$ Torr or more, and the partial pressure of the chlorine gas is set to fall within a pressure range within which the chlorine gas permits the highest etching rate of the compound semiconductor substrate.

7. The dry etching method according to claim 6, wherein the partial pressure of the chlorine gas is set to fall within a range of between $1 \times 10^{-4}$ and $1.2 \times 10^{-3}$ Torr.

8. The dry etching method according to claim 3, wherein the partial pressure of the inert gas is set constant and the partial pressure of the reactive gas is changed so as to control the angle made between the etched side wall and the surface of the compound semiconductor substrate.

9. The dry etching method according to claim 8, wherein the angle made between the etched side wall and the surface of the compound semiconductor substrate is controlled at 90°.

10. A dry etching method comprising the steps of:
providing a mixed gas by introducing at least one reactive gas and at least one inert gas into a plasma chamber for generating a plasma via gas flow adjusting means capable of controlling the flow rate of said reactive and insert gases into the plasma chamber and capable of controlling the partial pressure of each of said reactive and insert gases within the plasma chamber;

exciting the mixed gas within the plasma chamber so as to generate ionized particles and excited particles having high reactivity;

passing the particles through an electrode to supply the particles from the plasma chamber into a sample chamber having a compound semiconductor substrate made of a combination of at least two elements selected from the group consisting of In, Ga, As, and P housed therein, said compound semiconductor having a hetero-junction formed therein, adjacent layers forming the hetero-junction differing from each other in composition, said electrode being mounted at a communicating portion between the plasma chamber and the reaction chamber and being made of a carbon-containing material and being provided with a plurality of holes to pass through the particles; and physically and chemically etching the compound semiconductor substrate with the particles, the partial pressures of the inert gas and the reactive gas being controlled so as to achieve the same etching rate in each layer of the hetero-junction.

11. The dry etching method according to claim 11, wherein the carbon-containing material is pyrolytic graphite generated by thermal decomposition or the material covered with pyrolytic graphite.

12. The dry etching method according to claim 10, wherein the compound semiconductor substrate is housed in a heat insulating member.

13. The dry etching method according to claim 10, wherein the heat insulating member is made of a ceramic material.

14. The dry etching method according to claim 3, wherein said flow adjusting means is a mass flow controller.

15. The dry etching method according to claim 10, wherein said flow adjusting means is a mass flow controller.

16. The dry etching method of claim 3, wherein said mixed gas is excited by the simultaneous application of microwaves and a magnetic field thereto.

17. The dry etching method of claim 10, wherein said mixed gas is excited by the simultaneous application of microwaves and a magnetic field thereto.

* * * * *